United States Patent
Liu et al.

(10) Patent No.: US 10,622,471 B2
(45) Date of Patent: Apr. 14, 2020

(54) MANUFACTURING METHOD OF SEMICONDUCTOR STRUCTURE

(71) Applicant: TAIWAN SEMICONDUCTOR MANUFACTURING COMPANY LTD., Hsinchu (TW)

(72) Inventors: Sheng-De Liu, Taoyuan County (TW); Chung-Yen Chou, Hsinchu (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/199,563

(22) Filed: Nov. 26, 2018

(65) Prior Publication Data

US 2019/0109223 A1    Apr. 11, 2019

Related U.S. Application Data

(62) Division of application No. 15/062,972, filed on Mar. 7, 2016, now Pat. No. 10,141,438.

(51) Int. Cl.
*H01L 29/778* (2006.01)
*H01L 29/66* (2006.01)
*H01L 29/417* (2006.01)
*H01L 29/20* (2006.01)

(52) U.S. Cl.
CPC .... *H01L 29/7787* (2013.01); *H01L 29/41725* (2013.01); *H01L 29/66462* (2013.01); *H01L 29/2003* (2013.01); *H01L 29/41766* (2013.01)

(58) Field of Classification Search
None
See application file for complete search history.

(56) References Cited

U.S. PATENT DOCUMENTS

| | | | | |
|---|---|---|---|---|
| 6,593,217 B1 * | 7/2003 | Fujisawa | ........... | H01L 21/28518 257/E21.165 |
| 2014/0239350 A1 * | 8/2014 | Chou | ................ | H01L 29/66431 257/195 |

* cited by examiner

*Primary Examiner* — Steven B Gauthier
(74) *Attorney, Agent, or Firm* — WPAT, P.C., Intellectual Property Attorneys; Anthony King

(57) ABSTRACT

Present disclosure provides a method for manufacturing a semiconductor device, including providing a substrate, forming a first III-V compound layer over the substrate, forming a first passivation layer over the first III-V compound layer, forming a first opening from a top surface of the first passivation layer to the first III-V compound layer, each opening having a stair-shaped sidewall at the first passivation layer, depositing a metal layer over the first passivation layer and in the first opening, the metal layer having a second opening above the corresponding first opening, and removing a portion of the metal layer to form a source electrode and a drain electrode.

20 Claims, 16 Drawing Sheets

MANUFACTURING METHOD OF SEMICONDUCTOR STRUCTURE

CROSS REFERENCE TO RELATED APPLICATIONS

This application is a divisional application to U.S. non-provisional application Ser. No. 15/062,972, filed Mar. 7, 2016, and claims priority thereto.

FIELD

The present disclosure relates generally to a semiconductor structure and a method of manufacturing a semiconductor structure.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility, the ability to transmit signals at high frequencies, etc.

From an application point of view, enhancement-mode (E-mode) HEMTs have many advantages. E-mode HEMTs allow elimination of negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
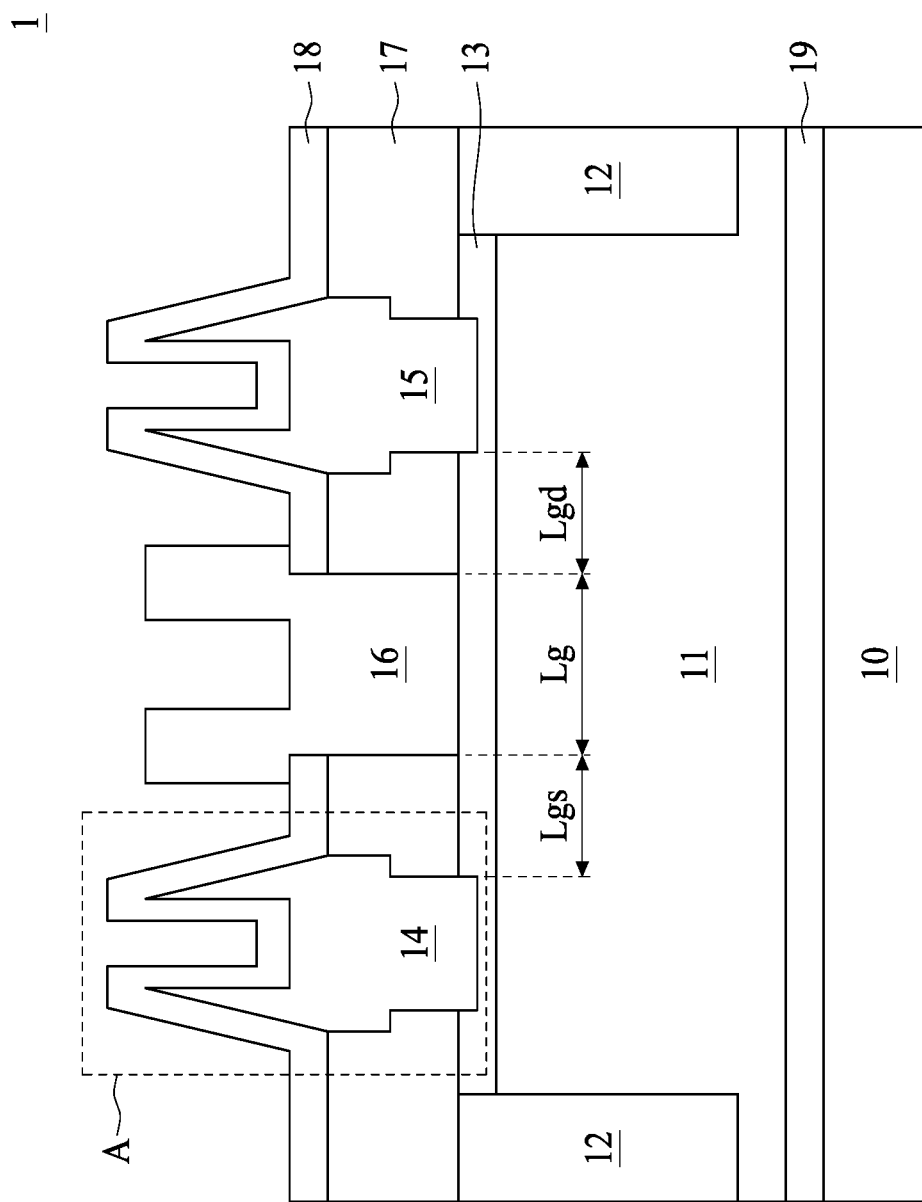
FIG. 1A is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1A is a cross-sectional view of a semiconductor structure 1 according to one or more embodiments of the present disclosure. In some embodiments, the semiconductor structure 1 may be a high electron mobility transistor (HEMT). The semiconductor structure 1 includes a substrate 10, a first III-V compound layer 13, a second III-V compound layer 11, isolation regions 12, a source region 14, a drain region 15, a gate region, a first passivation layer 17, a second passivation layer 18 and a buffer layer 19.

In some embodiments, the substrate 10 includes a silicon carbide (SiC) substrate, sapphire substrate or a silicon substrate. The semiconductor structure 10 also includes a heterojunction formed between two different semiconductor material layers, such as material layers with different band gaps. For example, the semiconductor structure 10 includes a non-doped narrow-band gap channel layer and a wide-band gap n-type donor-supply layer.

The buffer layer 19 is on the substrate 10. The buffer layer 19 acts as the buffer and/or the transition layer for the subsequently formed overlying layers. The buffer layer 19 may be epitaxially grown using Metal Organic Vapor Phase Epitaxy (MOVPE). The buffer layer 19 may function as an interface to reduce lattice mismatch between substrate 10 and the second III-V compound layer 11. In some embodiments, the buffer layer 19 includes an aluminum nitride (AlN) layer having a thickness in a range between about 10 nanometers (nm) and about 300 nm. The buffer layer 19 may include a single layer or a plurality of layers. For example, the buffer layer 19 may include a low-temperature AlN layer (not shown in the drawing) formed at a temperature between about 800° C. and about 1,200° C., and a high-temperature AlN layer (not shown in the drawing) formed at a temperature between about 1,000° C. and about 1,400° C.

The second III-V compound layer 11 is on the buffer layer 19. The second III-V compound layer 11 is a compound made from the III-V groups in the periodic table of elements. In some embodiments of the present example, the second III-V compound layer 11 includes a gallium nitride (GaN) layer. In some embodiments, the second III-V compound layer 11 includes a GaAs layer or InP layer. In some embodiments, the second III-V compound layer 11 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals.

The second III-V compound layer 11 is undoped. Alternatively, the second III-V compound layer 11 is unintentionally doped, such as lightly doped with n-type dopants due to a precursor used to form the second III-V compound layer 11. In some embodiments, the second III-V compound layer 11 has a thickness in a range from about 0.5 microns (μm) to about 10 μm.

The first III-V compound layer 13 is on the second III-V compound layer 11. The first III-V compound layer 13 is a compound made from the III-V groups in the periodic table of elements. The first III-V compound layer 13 and the second III-V compound layer 11 are different from each other in composition. In some embodiments of the present example, the first III-V compound layer 13 includes an aluminum gallium nitride (AlGaN) layer. In some embodiments, the first III-V compound layer 13 includes an AlGaAs layer or an AlInP layer.

The first III-V compound layer 13 is intentionally doped. In some embodiments, the first III-V compound layer 13 has a thickness in a range from about 5 nm to about 50 nm.

The source region 14 is on the first III-V compound layer 13. In some embodiments, the source region 14 includes Au and comprises Al, Ti, Ni, Au or Cu. The drain region 15 is on the first III-V compound layer 13 and spaced apart from the source region 14. In some embodiments, the drain region 15 includes Au and comprises Al, Ti, Ni, Au or Cu.

The gate region 16 is on the first III-V compound layer 13 and between the source region 14 and the drain region 15. The gate region 16 includes a conductive material layer configured for voltage bias. In some embodiments, the conductive material layer includes a refractory metal or its compounds, e.g., titanium (Ti), titanium nitride (TiN), titanium tungsten (TiW) and tungsten (W). Alternatively, the conductive material layer includes nickel (Ni), gold (Au) or copper (Cu).

The isolation regions 12 are at both sides within the second III-V compound layer 11 and the first III-V compound layer 13. The isolation regions 12 isolate the HEMT in the semiconductor structure 1 from other devices in the substrate 10. In some embodiments, the isolation regions 12 include doped regions with species of oxygen or nitrogen.

The first passivation layer 17 is on the first III-V compound layer 13 and the isolation layers 12. The first passivation layer 17 surrounds a portion of the source region 14, the drain region 15 and the gate region 16. The first passivation layer 17 is configured to protect the underlying first III-V compound layer 13 from damage in the process having plasma. In some embodiments, the first passivation layer 17 has a thickness in a range between about 100 Å and about 5,000 Å. In some embodiments, the first passivation layer 17 includes silicon oxide and/or silicon nitride. When comprising silicon nitride, the first passivation layer 17 may be formed by performing a Low-Pressure Chemical Vapor Deposition (LPCVD) method (without plasma) using $SiH_4$ and $NH_3$ gases.

The second passivation layer 18 is on the first passivation layer 17 and covers the remaining portions of the source region 14 and the drain region 15 that are not covered by the first passivation layer 17. In some examples, the second passivation layer 18 comprises silicon oxide, silicon nitride, gallium oxide, aluminum oxide, scandium oxide, zirconium oxide, lanthanum oxide or hafnium oxide.

In some embodiments, the semiconductor structure 1 may further include a protection layer (not shown in the drawing). The protection layer is disposed between the source region 14 and the second passivation layer 18 and between the drain region 15 and the second passivation layer 18. The protection layer covers the source region 14 and the drain region 15, and prevents the source region 14 and the drain region 15 from exposure during an annealing process in the formation of the isolation regions 12.

In the above described embodiments, the gate region 16, the source region 14 and the drain region 15 are configured as a transistor. When a voltage is applied to the gate stack, a device current of the transistor could be modulated.

Figure 1B:
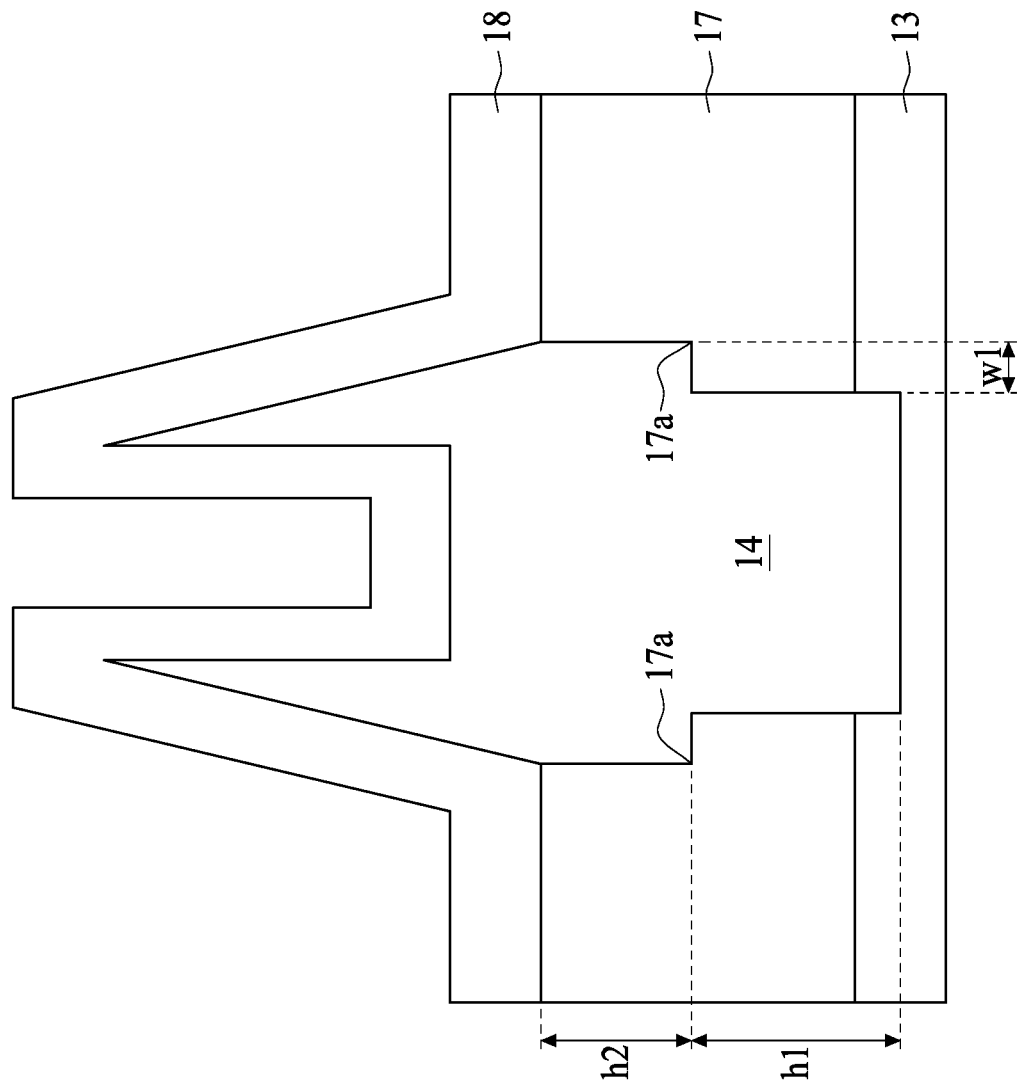
FIG. 1B illustrates an enlarged view of the semiconductor structure in FIG. 1A, taken along the dotted rectangle A in accordance with some embodiments of the present disclosure.

FIG. 1B illustrates an enlarged view of the source region 14 of the semiconductor structure 1 of FIG. 1A, taken along the dotted rectangle A. As shown in FIG. 1B, the first III-V compound layer 13 has a concave portion in which the source region 14 is located. The first III-V compound layer 13 is a compound made from the III-V groups in the periodic table of elements. In some embodiments of the present example, the first III-V compound layer 13 includes an aluminum gallium nitride (AlGaN) layer. In some embodiments, the first III-V compound layer 13 includes an AlGaAs layer or an AlInP layer. The first III-V compound layer 13 is intentionally doped. In some embodiments, the first III-V compound layer 13 has a thickness in a range from about 5 nm to about 50 nm.

The first passivation layer 17 is located on the first III-V compound layer 13. The first passivation layer 17 has an opening. The sidewall of the opening has two stair-shaped portions 17a. In some embodiments, the height h1 of the sidewall of the concave portion and the lower step of the stepped-shape portion 17a is greater than the height h2 of the sidewall of the upper step of the stepped-shape portion 17a. In some embodiments, the width w1 of the stepped-shape portion 17a is in a range from about 0.03 μm to about 0.05 μm.

The first passivation layer 17 is configured to protect the underlying first III-V compound layer 13 from damage in plasma-related process. In some embodiments, the first passivation layer 17 has a thickness in a range between about 100 Å and about 5,000 Å. In some embodiments, the first passivation layer 17 includes silicon oxide and/or silicon nitride. When comprising silicon nitride, the first passivation layer 17 may be formed by performing a Low-Pressure Chemical Vapor Deposition (LPCVD) method (without plasma) using $SiH_4$ and $NH_3$ gases.

The source region 14 is located in a recess of the first passivation layer 17 and a recess of the first III-V compound layer 13. In some embodiments, the source region 14 includes Au, Al, Ti, Ni, Au or Cu.

The second passivation layer 18 is on the first passivation layer 17 and covers the portions of the source region 14 that are not covered by the first passivation layer 17. In some examples, the second passivation layer 18 comprises silicon oxide, silicon nitride, gallium oxide, aluminum oxide, scandium oxide, zirconium oxide, lanthanum oxide or hafnium oxide.

As shown in FIG. 1A, the on resistance (Ron) of the semiconductor structure 1 is proportional to the distance Lgs between the source region 14 and the gate region 16, the width Lg of the gate region 16 and the distance Lgd between the drain region 15 and the gate region 16. The distance Lgs includes the overlaying portion of the source region 14 and the first passivation layer 17. Similarly, the distance Lgd includes the overlaying portion of the drain region 15 and the first passivation layer 17. According to the present disclosure, the length of overlaying portion is defined by the width w1 of the stepped-shape portion 17a. In comparison with the existing semiconductor structure (in which the overlay length is about 0.2 μm), the semiconductor structure 1 shown in FIG. 1A has smaller overlaying length (in a range from about 0.03 μm to about 0.05 μm). Reducing the overlay length would reduce the length Lgs and Lgd, which would in turn reduce the on resistance of the semiconductor structure 1.

FIG. 2A to FIG. 2H are cross-sectional views of a CMOS-MEMS structure fabricated at various stages, in accordance with some embodiments of the present disclosure. Various figures have been simplified for a better understanding of the inventive concepts of the present disclosure.

Figure 2A:
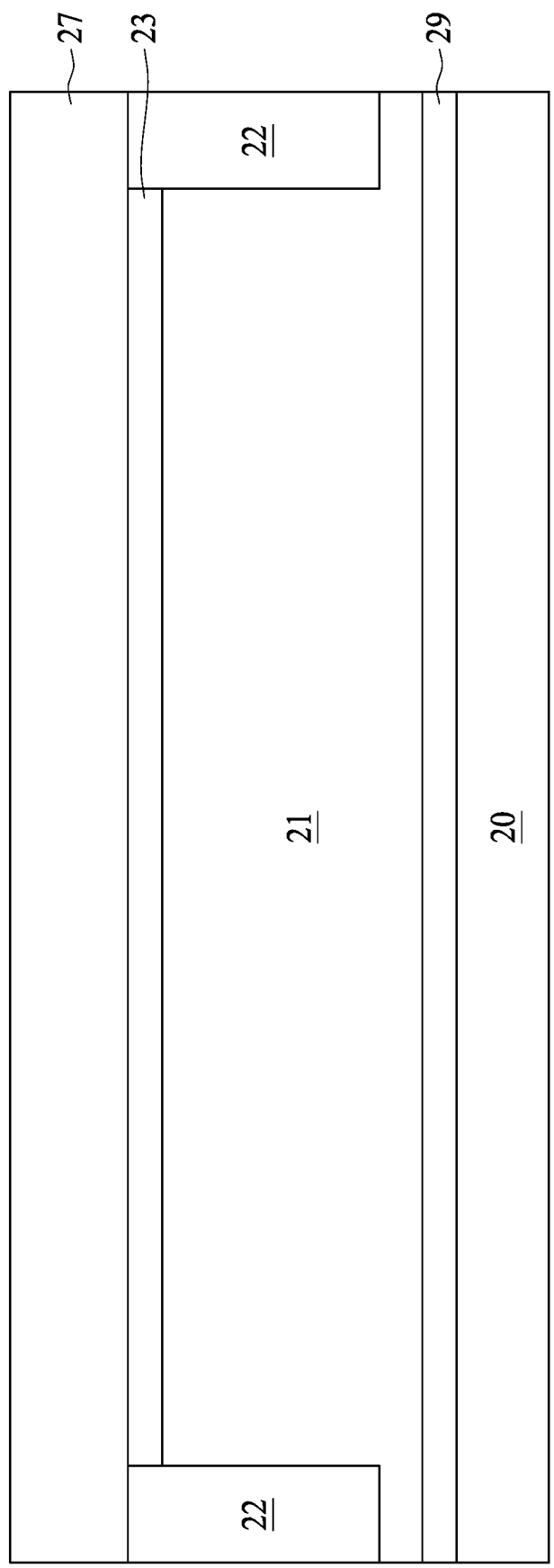
FIGS. 2A-2H are a series of cross-sectional views illustrating processing steps to fabricate the semiconductor structure, in accordance with some embodiments of the present disclosure.

Referring to FIG. 2A, a substrate 20 is provided. The substrate 20 includes a silicon carbide (SiC) substrate, sapphire substrate or a silicon substrate. The semiconductor structure 20 also includes a heterojunction formed between two different semiconductor material layers, such as material layers with different band gaps. For example, the semiconductor structure 20 includes a non-doped narrow-band gap channel layer and a wide-band gap n-type donor-supply layer.

The buffer layer 29 is formed on the substrate 20. The buffer layer 29 acts as the buffer and/or the transition layer for the subsequently formed overlying layers. The buffer layer 29 may be epitaxially grown using Metal Organic Vapor Phase Epitaxy (MOVPE). The buffer layer 29 may function as an interface to reduce lattice mismatch between substrate 20 and the subsequently formed III-V compound layer. In some embodiments, the buffer layer 29 includes an aluminum nitride (AlN) layer having a thickness in a range between about 10 nanometers (nm) and about 300 nm. The buffer layer 29 may include a single layer or a plurality of layers. For example, the buffer layer 29 may include a low-temperature AlN layer (not shown in the drawing) formed at a temperature between about 800° C. and about 1,200° C., and a high-temperature AlN layer (not shown in the drawing) formed at a temperature between about 1,000° C. and about 1,400° C.

The second III-V compound layer 21 is formed on the buffer layer 19. The second III-V compound layer 21 is a compound made from the III-V groups in the periodic table of elements. In some embodiments of the present example, the second III-V compound layer 21 includes a gallium nitride (GaN) layer. In some embodiments, the second III-V compound layer 21 includes a GaAs layer or InP layer. In some embodiments, the second III-V compound layer 21 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals.

The second III-V compound layer 21 is undoped. Alternatively, the second III-V compound layer 21 is unintentionally doped, such as lightly doped with n-type dopants due to a precursor used to form the second III-V compound layer 21. In some embodiments, the second III-V compound layer 21 has a thickness in a range from about 0.5 μm to about 10 μm.

The first III-V compound layer 23 is formed on the second III-V compound layer 21. The first III-V compound layer 23 is a compound made from the III-V groups in the periodic table of elements. The first III-V compound layer 23 and the second III-V compound layer 21 are different from each other in composition. In some embodiments of the present example, the first III-V compound layer 23 includes an aluminum gallium nitride (AlGaN) layer. In some embodiments, the first III-V compound layer 23 includes an AlGaAs layer or an AlInP layer. The first III-V compound layer 23 is intentionally doped. In some embodiments, the first III-V compound layer 23 has a thickness in a range from about 5 nm to about 50 nm. The first III-V compound layer 23 is epitaxially grown on the second III-V compound layer 21 by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical.

The isolation regions 22 are formed in the second III-V compound layer 21 and at both edges of the first III-V compound layer 23. In some embodiments, the isolation regions 22 are formed by an implantation process with species of oxygen or nitrogen.

The first passivation layer 27 is formed on the first III-V compound layer 23 and the isolation layers 22. In some embodiments, the first passivation layer 27 has a thickness in a range between about 100 Å and about 5,000 Å. In some embodiments, the first passivation layer 27 includes silicon oxide and/or silicon nitride. In some embodiments, the first passivation layer 27 is formed by performing a low pressure chemical vapor deposition (LPCVD) method without plasma using $SiH_4$ and $NH_3$ gases. An operation temperature is in a range of from about 650° C. to about 800° C. An operation pressure is in a range of about 0.1 Torr and about 1 Torr. The first passivation layer 27 protects the underlying first III-V compound layer 23 from damage in the following processes having plasma.

Figure 2B:
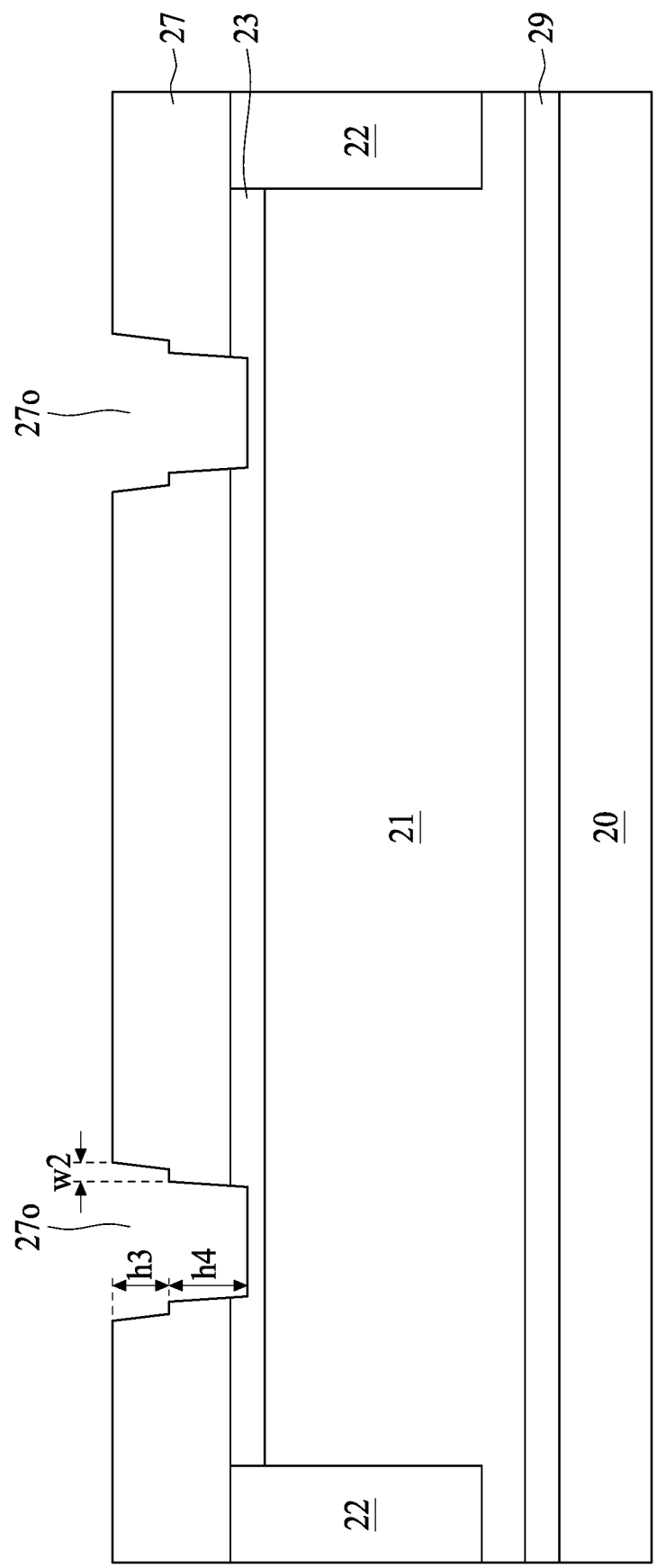

Referring to FIG. 2B, two openings 27o are formed from the top surface of the first passivation layer 27 to a portion of the first III-V compound layer 23. Two openings 27o in the first passivation layer 27 are defined by lithography and etching processes to expose a portion of the first III-V compound layer 23. The opening 27o is stair shape. In some embodiments, the stair is around the middle portion of the sidewall of the first passivation layer 27, and thus the height h3 of the upper portion of the stepped-shape openings 27o is less than the height h4 of the lower portion of the stepped-shape openings 27o. In some embodiments, the width w2 of the step is in a range from about 0.03 μm to about 0.05 μm.

Figure 2C:
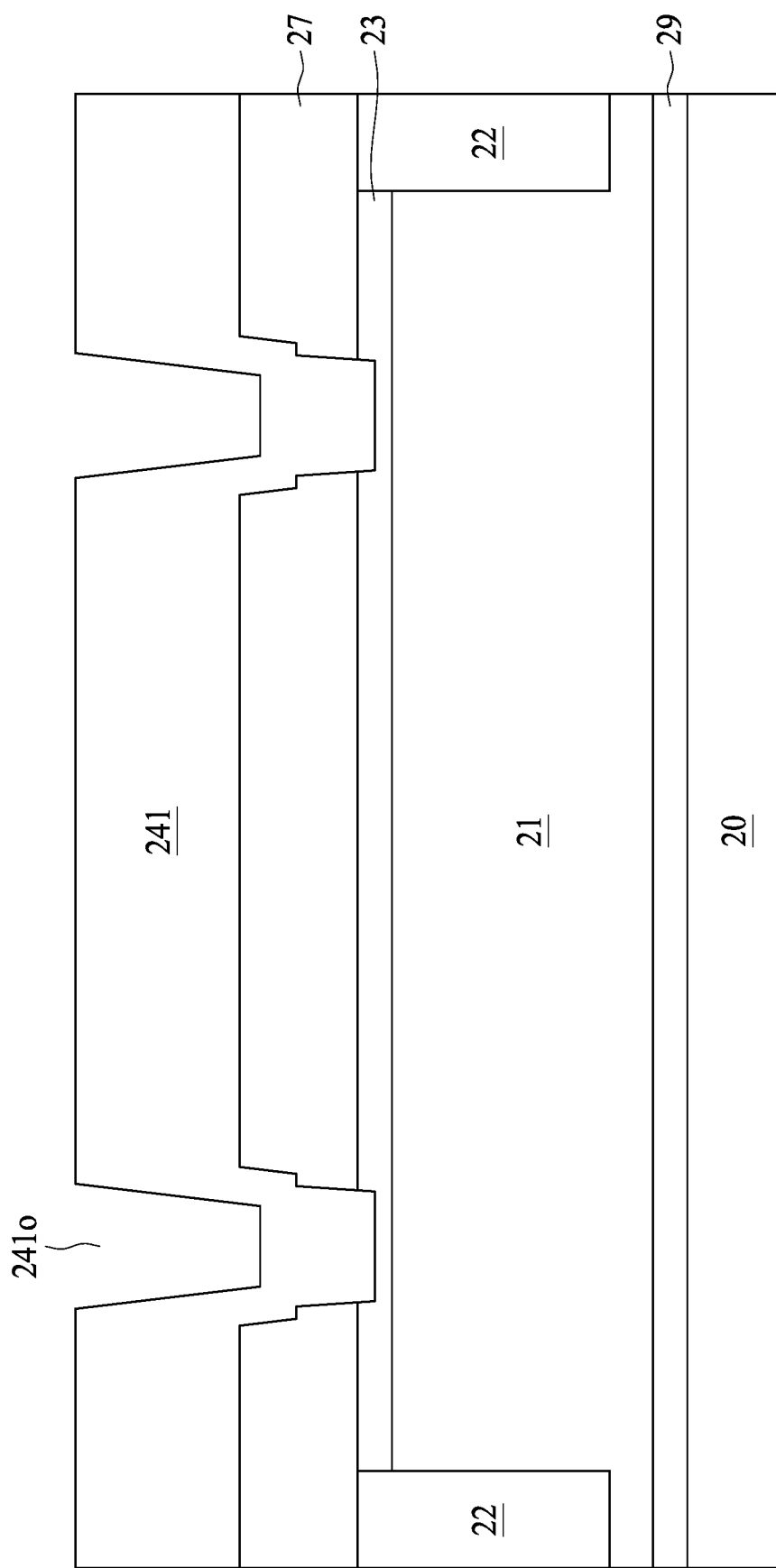

Referring to FIG. 2C, a metal layer 241 is deposited over the first passivation layer 27, filling into the openings of the first passivation layer 27 and contacting the first III-V compound layer 23. In some embodiments, the metal layer 241 is deposited by using sputtering, atomic layer deposition (ALD) or physical vapor deposition (PVD) operations. In some embodiments, the metal layer 241 includes Au, Al, Ti, Ni, Au or Cu. The metal layer 241 has two openings 241o located over the openings 27o shown in FIG. 2B.

Figure 2D:
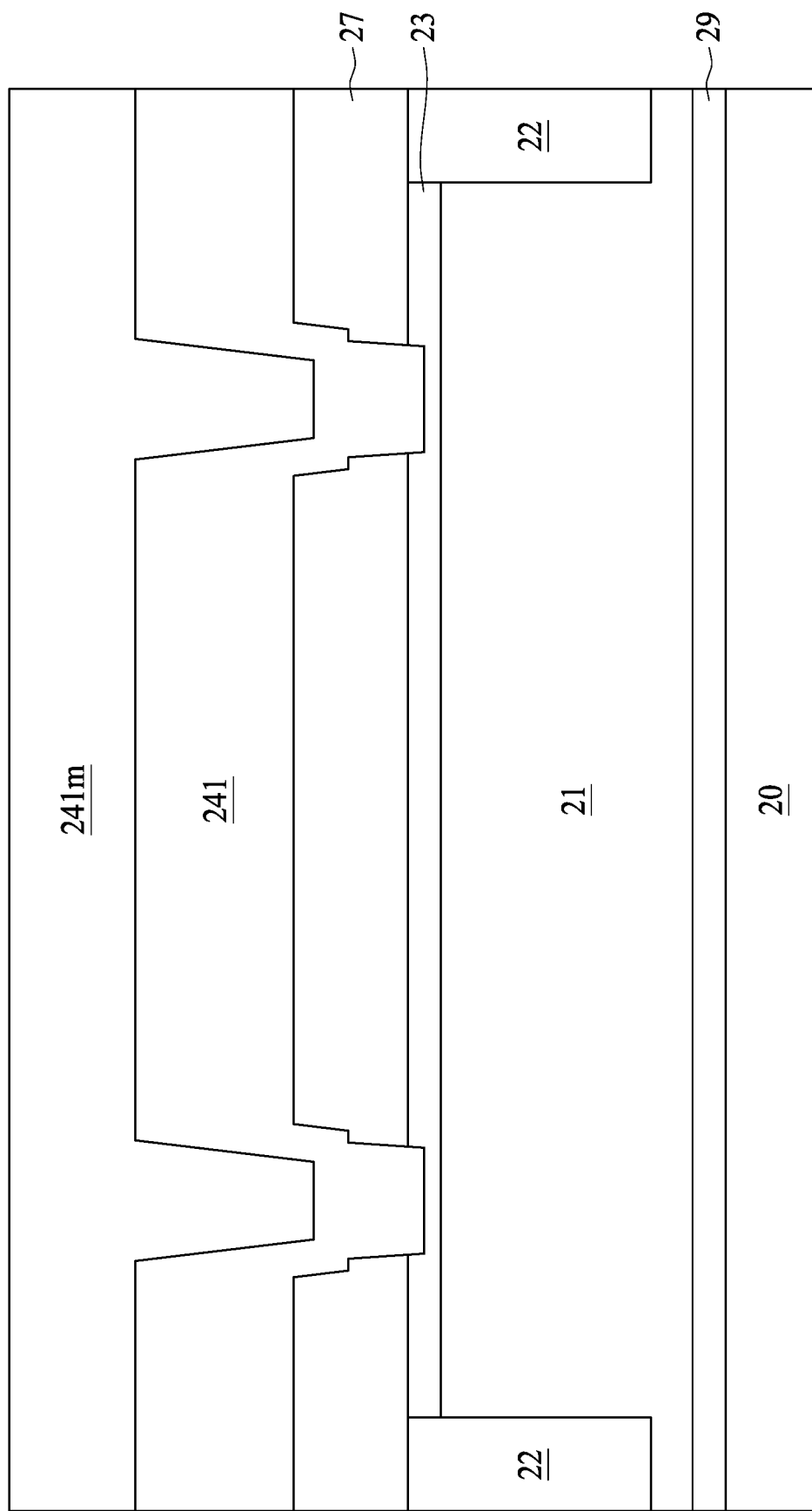

Referring to FIG. 2D, a photoresist (or mask) 241m is placed on the metal layer 241 and filling into the openings 241o of the metal layer 241. The photoresist 241m is patterned to serve as an etching mask.

Figure 2E:
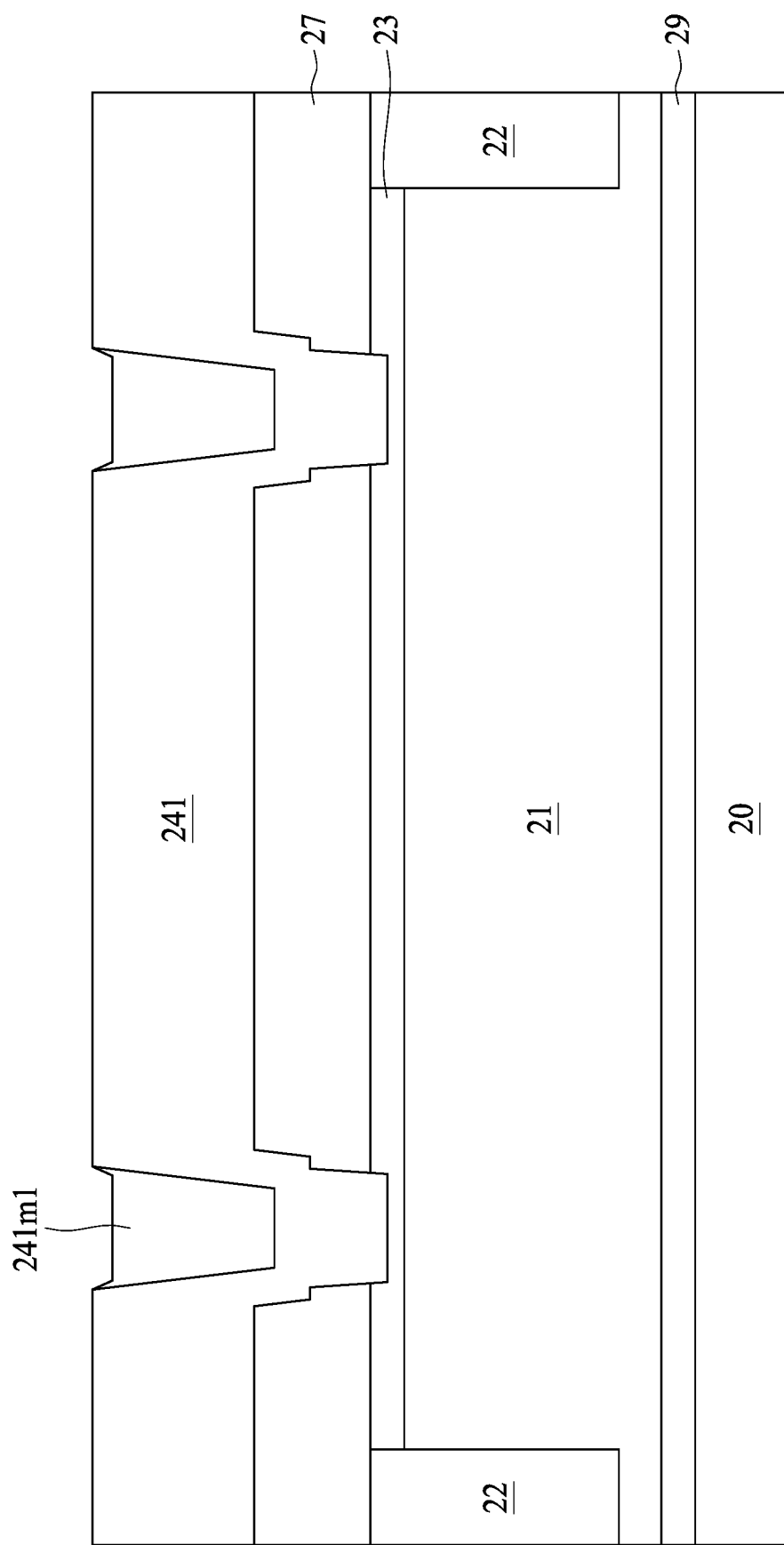

Referring to FIG. 2E, an etching back operation is performed on the photoresist 241m to remove the photoresist from the top surface of the metal layer 241 and the remaining photoresist 241m1 is disposed in the openings of the metal layer 241. As illustrated in FIG. 2E, a top surface of the remaining photoresist 241m1 is lower than the top surface of the metal layer 241. However, the top surface of the remaining photoresist 241m1 may be substantially at the same height or higher than the top surface of the metal layer 241. The photoresist layer can serve as the etch mask for subsequent operations. One of ordinary skill in the art would recognize many variations, modifications, and alternatives.

Figure 2F:
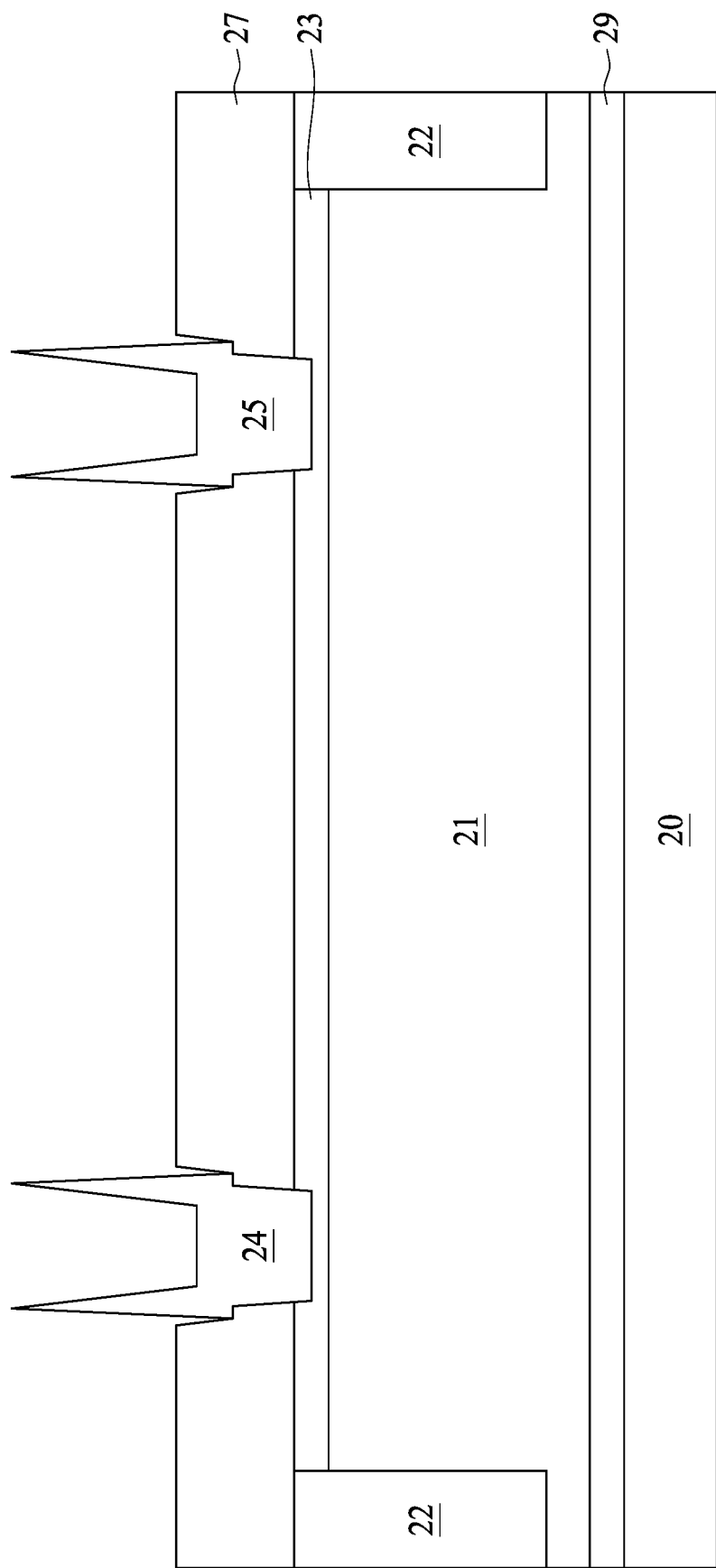

Referring to FIG. 2F, the metal layer 241 not covered by the photoresist 241m1 is removed by an etching operation, such as a reactive ion etch (RIE) process that etches the exposed portions of the metal layer 241, is conducted and the etch until the underlying first passivation layer 27 is exposed. The source region 24 and the drain region 25 can be obtained after the etching operation. The photoresist layer 241m1 is removed after the formation of the source region 24 and the drain region 25. During the etching operation, the photoresist 241m reacts with the recessed sidewall of the metal layer 241 and form byproducts that are resistant to the RIE. The byproduct may be in a form of triangular region (from a cross sectional view) surrounding the recessed sidewall of the metal layer 241. Because the byproduct region is resistant to the RIE, and at the same time, the byproduct region is disposed over the step at the sidewall of the first passivation layer 27, serving as an etching stop-layer to prevent the metal layer from being etched further down to the openings of the first passivation layer 27. The first passivation layer 27 protects the underlying first III-V compound layer 23 from damage during the etching operation.

Note the source region 24 and the drain region 25 are formed by a self-align process where the photoresist 241m1 serves as an etching mask defining the shape of the source region 24 and the drain region 25.

Next, a protection layer (not shown) is optionally deposited on the source region 24, the drain region 25 and the first passivation layer 27. In some embodiments, the protection layer includes dielectric materials such as $SiO_2$ or $Si_3N_4$. In one example, the protection layer is $Si_3N_4$. and is formed by performing a plasma enhanced chemical vapor deposition (PECVD) method.

Figure 2G:
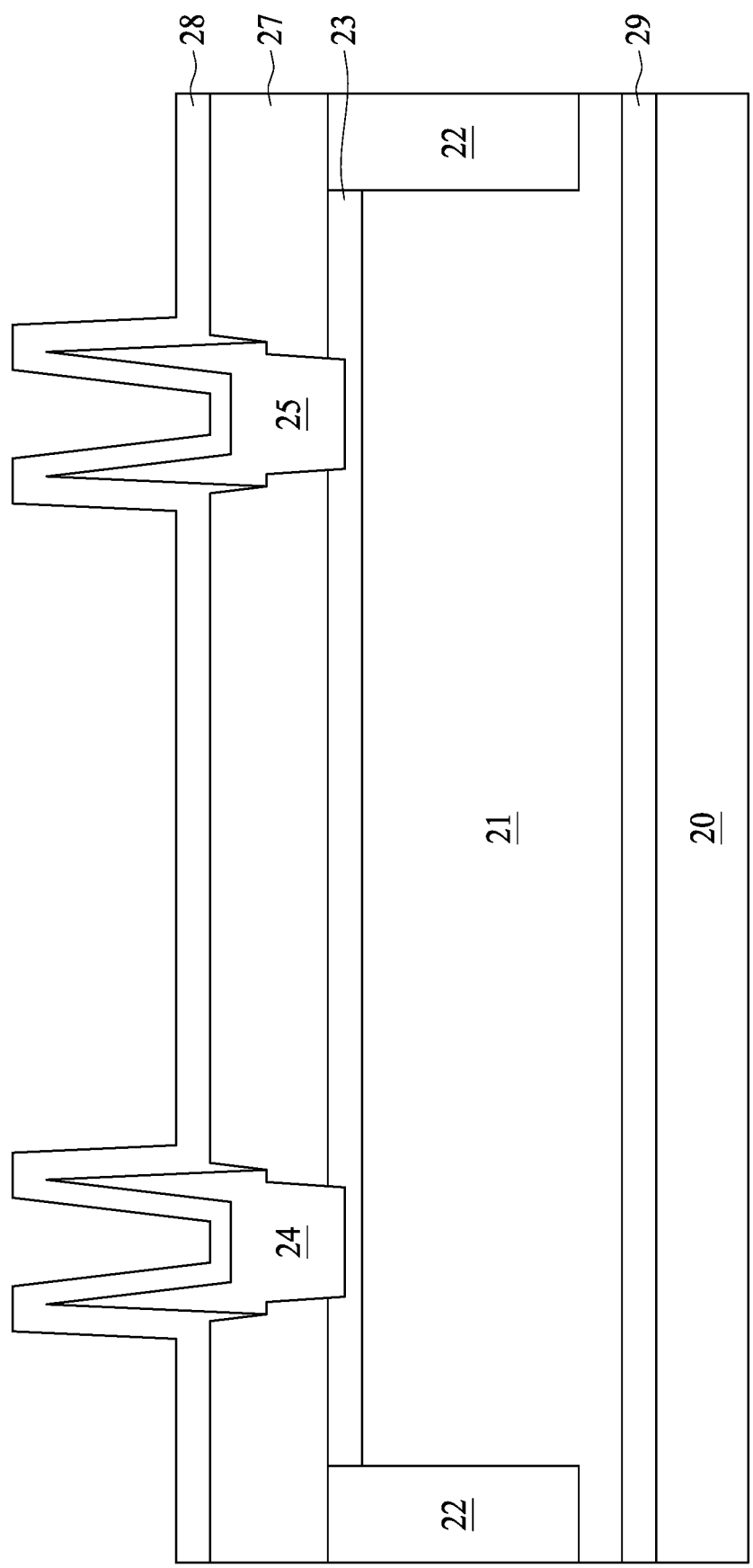

Referring to FIG. 2G, a second passivation layer 28 is deposited on the source region 24, the drain region 25 and the first passivation layer 27. In some embodiments, the second passivation layer 28 is in a thickness range from about 3 nm to about 20 nm. In some examples, the second passivation layer 28 comprises silicon oxide, silicon nitride, gallium oxide, aluminum oxide, scandium oxide, zirconium oxide, lanthanum oxide or hafnium oxide. In one embodiment, the second passivation layer 28 is formed by an atomic layer deposition (ALD) method. The ALD method is based on the sequential use of a gas phase chemical process. The majority of ALD reactions use two chemicals, typically called precursors. These precursors react with a surface one-at-a-time in a sequential manner. By exposing the precursors to the growth surface repeatedly, the second passivation layer 28 is deposited. The ALD method provides a uniform thickness of the second passivation layer 28 with high quality. In one example, the second passivation layer 28 is zirconium oxide. In some embodiments, a first precursor includes tetrakis[ethylmethylamino]zirconium (TEMAZr) or zirconium chloride ($ZrCl_4$). In some embodiments, a second precursor includes oxygen in order to oxidize the first precursor material to form a monolayer. In some examples, the second precursor includes ozone ($O_3$), oxygen, water ($H_2O$), $N_2O$ or $H_2O_2$. In other embodiments, the second passivation layer 28 is formed by a plasma enhanced chemical vapor deposition (PECVD) or a low pressure chemical vapor deposition (LPCVD).

Figure 2H:
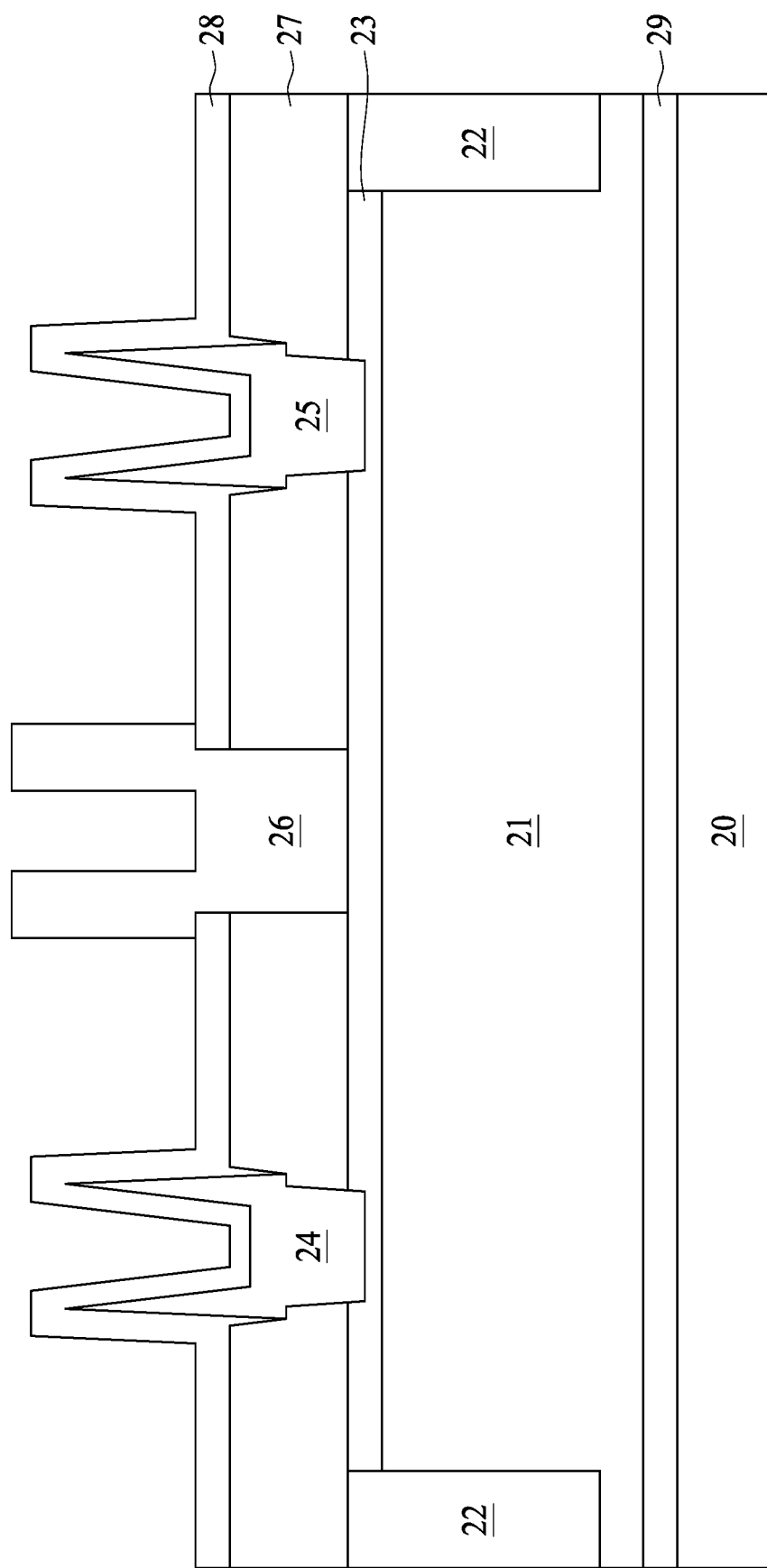

Referring to FIG. 2H, an opening is formed in the second passivation layer 28 and the first passivation layer 27. The opening is disposed between the source region 24 and the drain region 25 to expose a top surface of the first III-V compound layer 23. Then a metal layer is deposited in the opening to from the gate region 26. In some embodiments, the gate region 26 includes a refractory metal or its compounds, e.g., titanium (Ti), titanium nitride (TiN), titanium tungsten (TiW) and tungsten (W). Alternatively, the gate region 26 includes nickel (Ni), gold (Au) or copper (Cu).

As stated above, reducing the overlaying width of the source region and the first passivation layer as well as the overlaying width of the drain region and the first passivation layer would reduce the on resistance of the semiconductor structure. As shown in FIG. 2F, during the etching operation, the photoresist 241m reacts with the recessed sidewall of the metal layer 241 and form byproducts that are resistant to the RIE. The byproduct may be in a form of triangular region (from a cross sectional view) surrounding the recessed sidewall of the metal layer 241. Because the byproduct region is resistant to the RIE, and at the same time, the byproduct region is disposed over the step at the sidewall of the first passivation layer 27, serving as an etching stop-layer to prevent the metal layer from being etched further down to the openings of the first passivation layer 27. The first passivation layer 27 protects the underlying first III-V compound layer 23 from damage during the etching operation. Therefore, no further photoresist is required for metal layer etching to form the source region 24 and the drain region 25. Therefore, in comparison with the existing approaches that use a further photoresist for metal etching to form the source region or drain region, the operations shown in FIGS. 2A-2H would reduce the manufacturing cost.

In addition, as shown in FIG. 2B, the overlaying width of the source/drain region and the first passivation layer is defined by the width w2 of the stepped-shape sidewall of the first passivation layer 27. In comparison with the existing semiconductor structure (in which the overlaying width is about 0.2 µm), the semiconductor structure formed by the operations shown in FIGS. 2A-2H has smaller overlaying width (in a range from about 0.03 µm to about 0.05 µm). Reducing the overlaying width would reduce the on resistance of the semiconductor device, which would in turn enhance the performance of the semiconductor device.

Figure 3A:
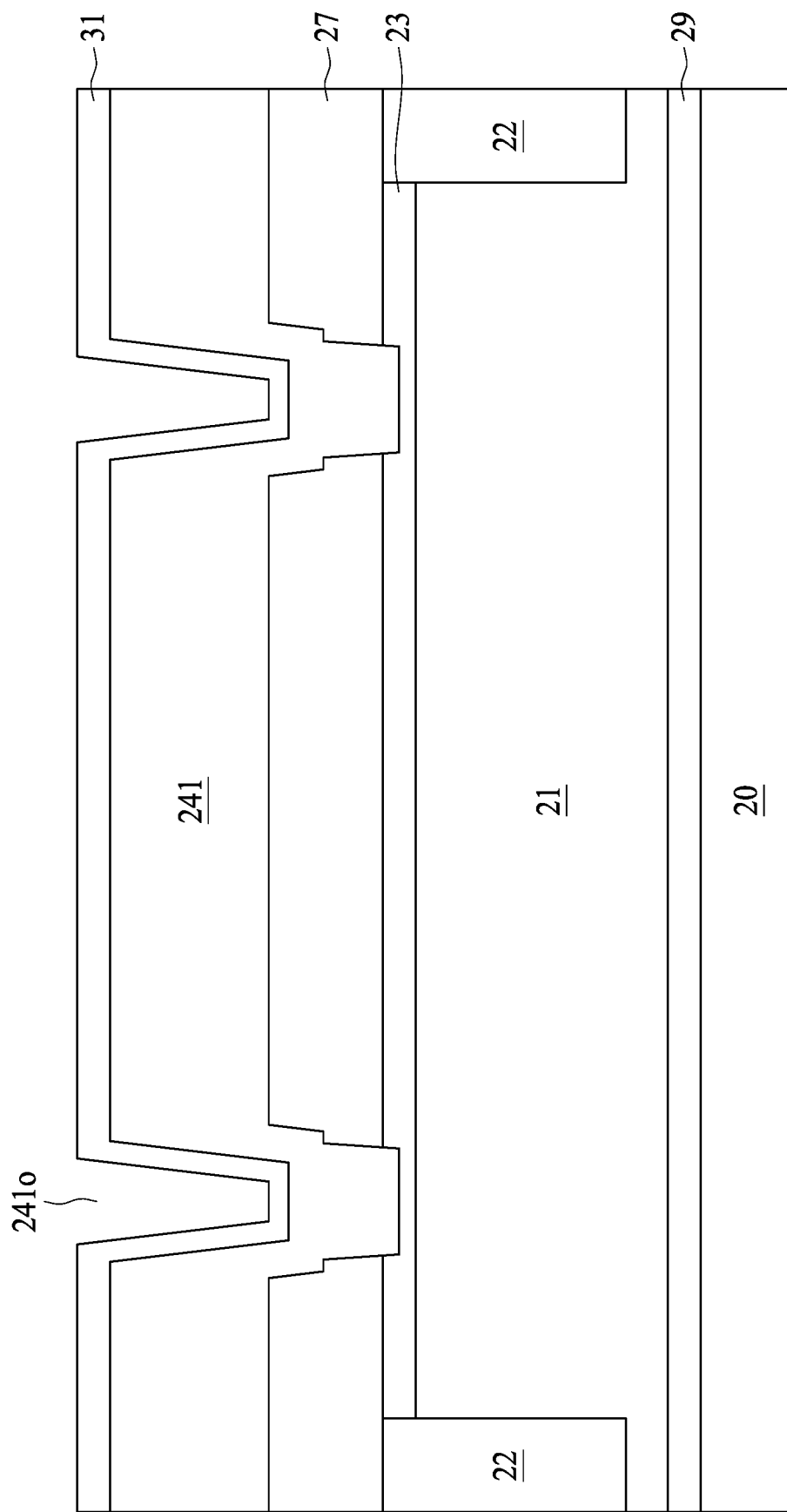
FIGS. 3A-3F are a series of cross-sectional views illustrating processing steps to fabricate the semiconductor structure, in accordance with some embodiments of the present disclosure.
Figure 3B:
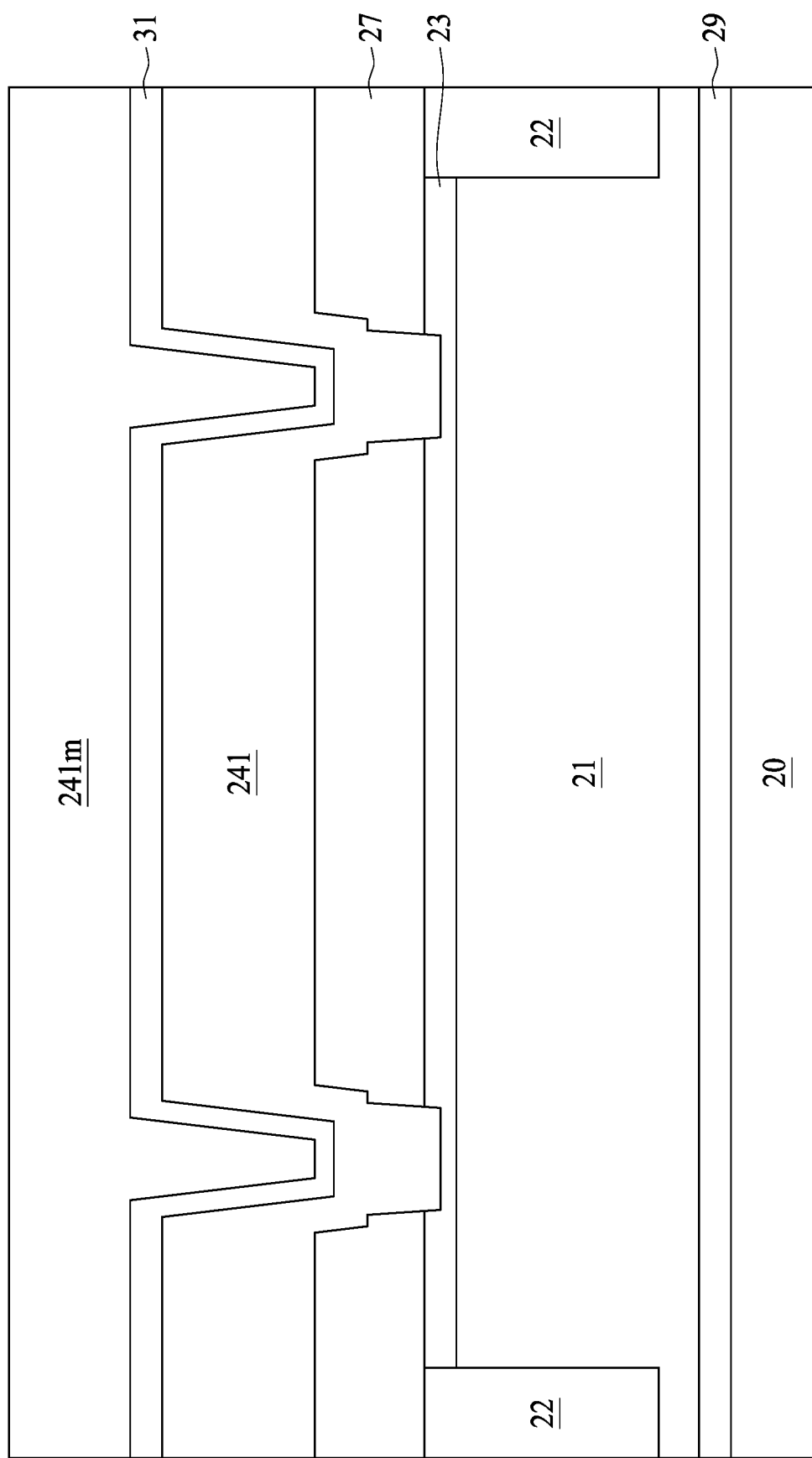
Figure 3C:
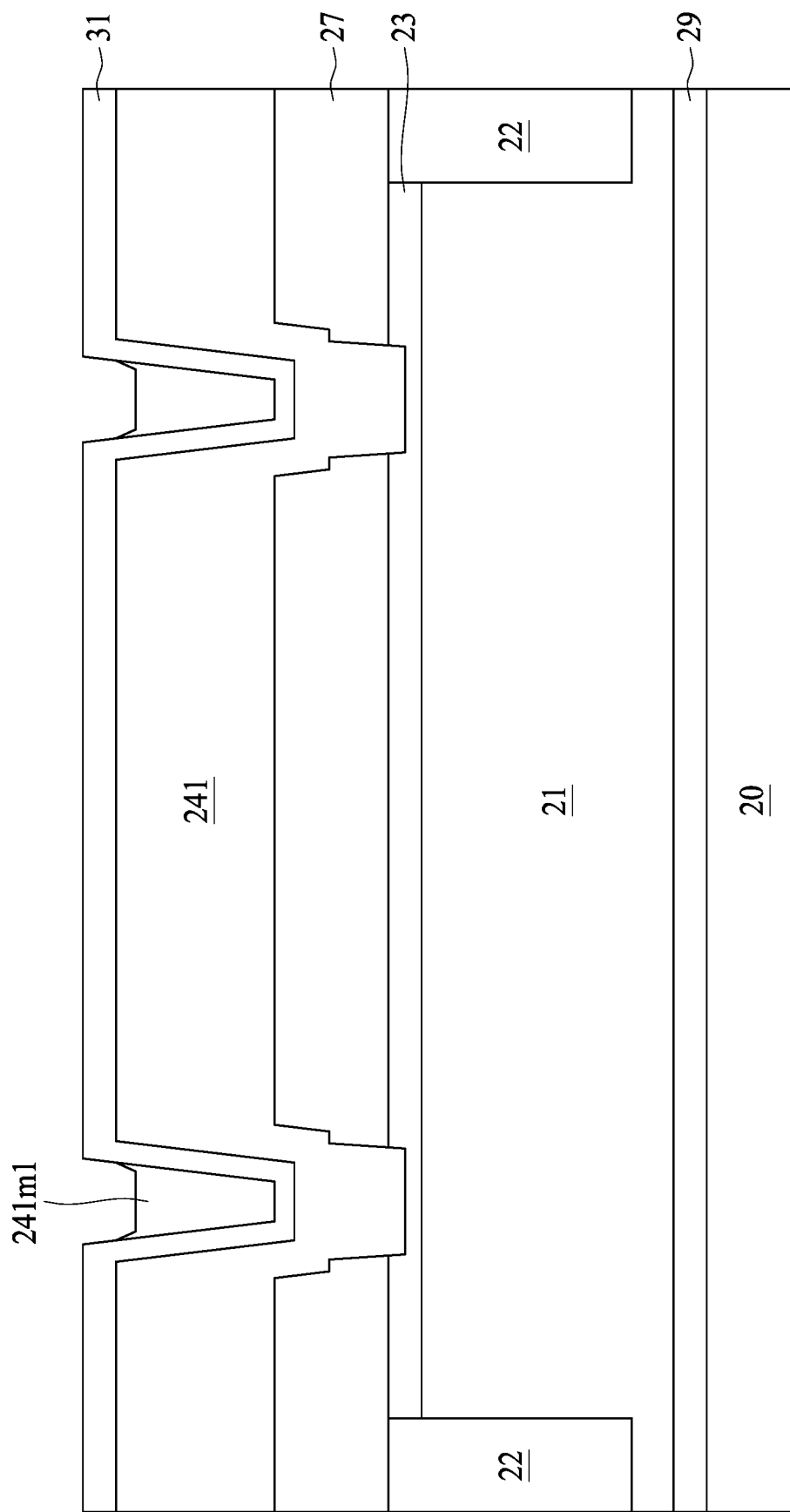
Figure 3D:
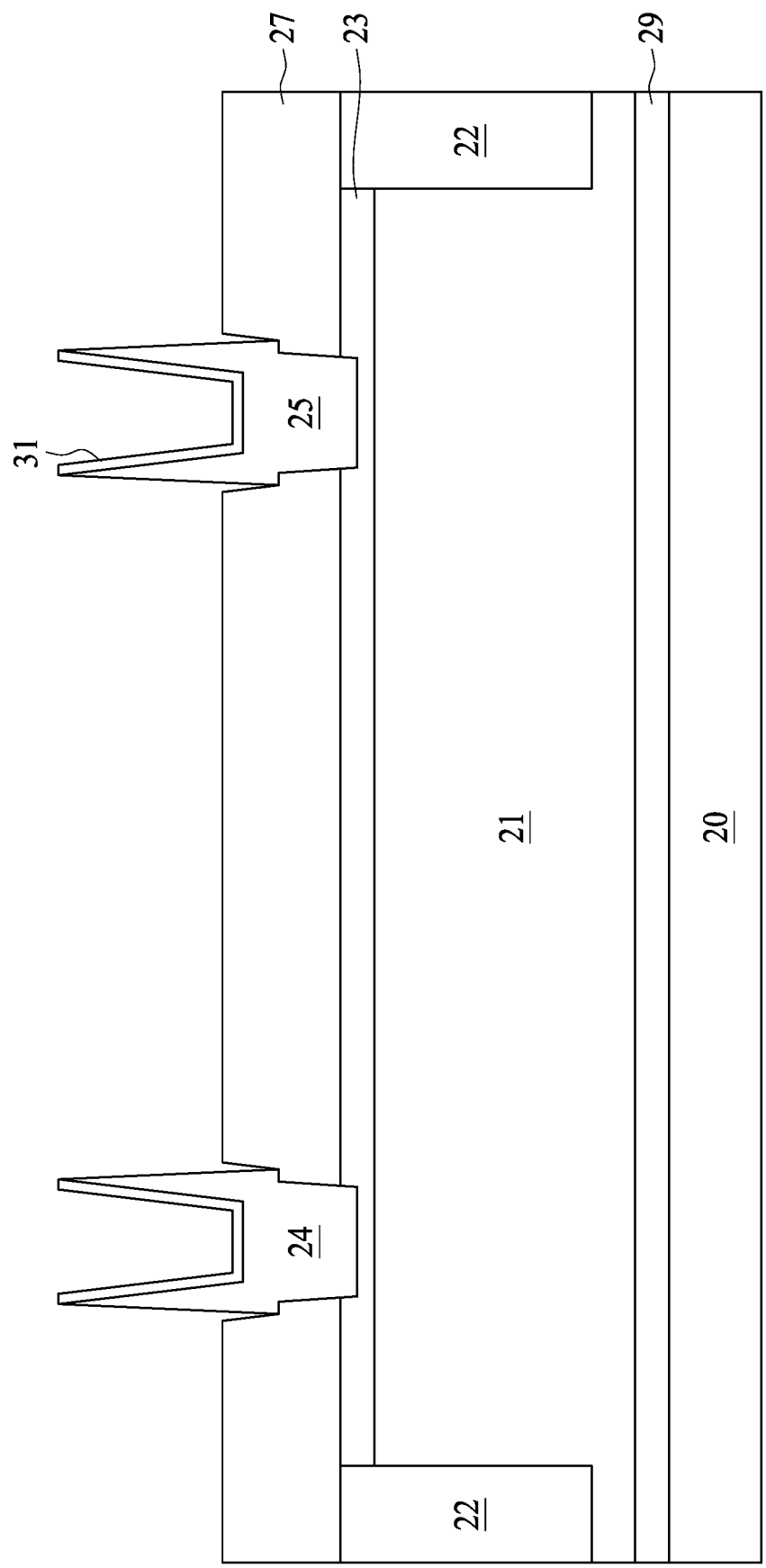
Figure 3E:
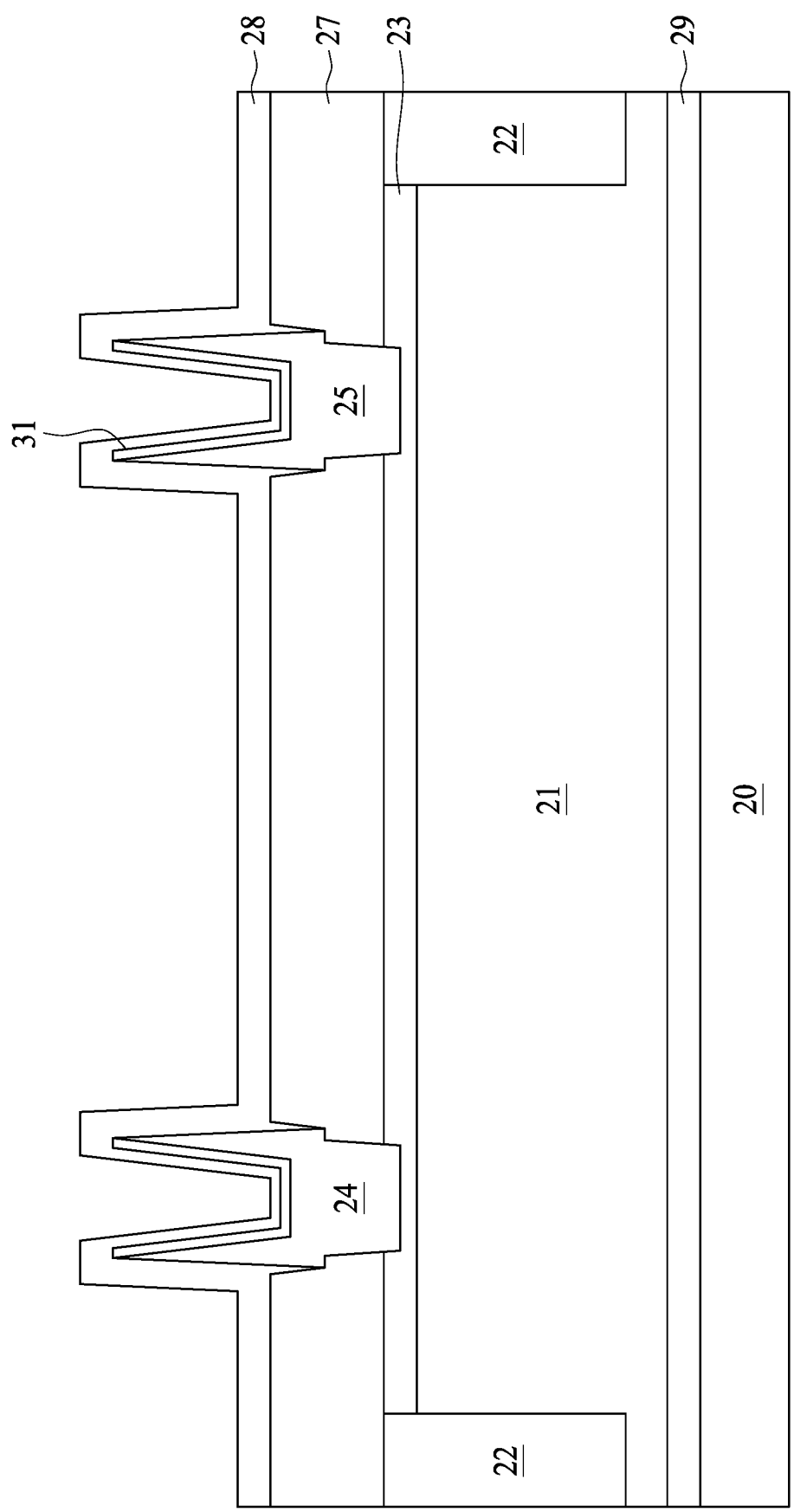
Figure 3F:
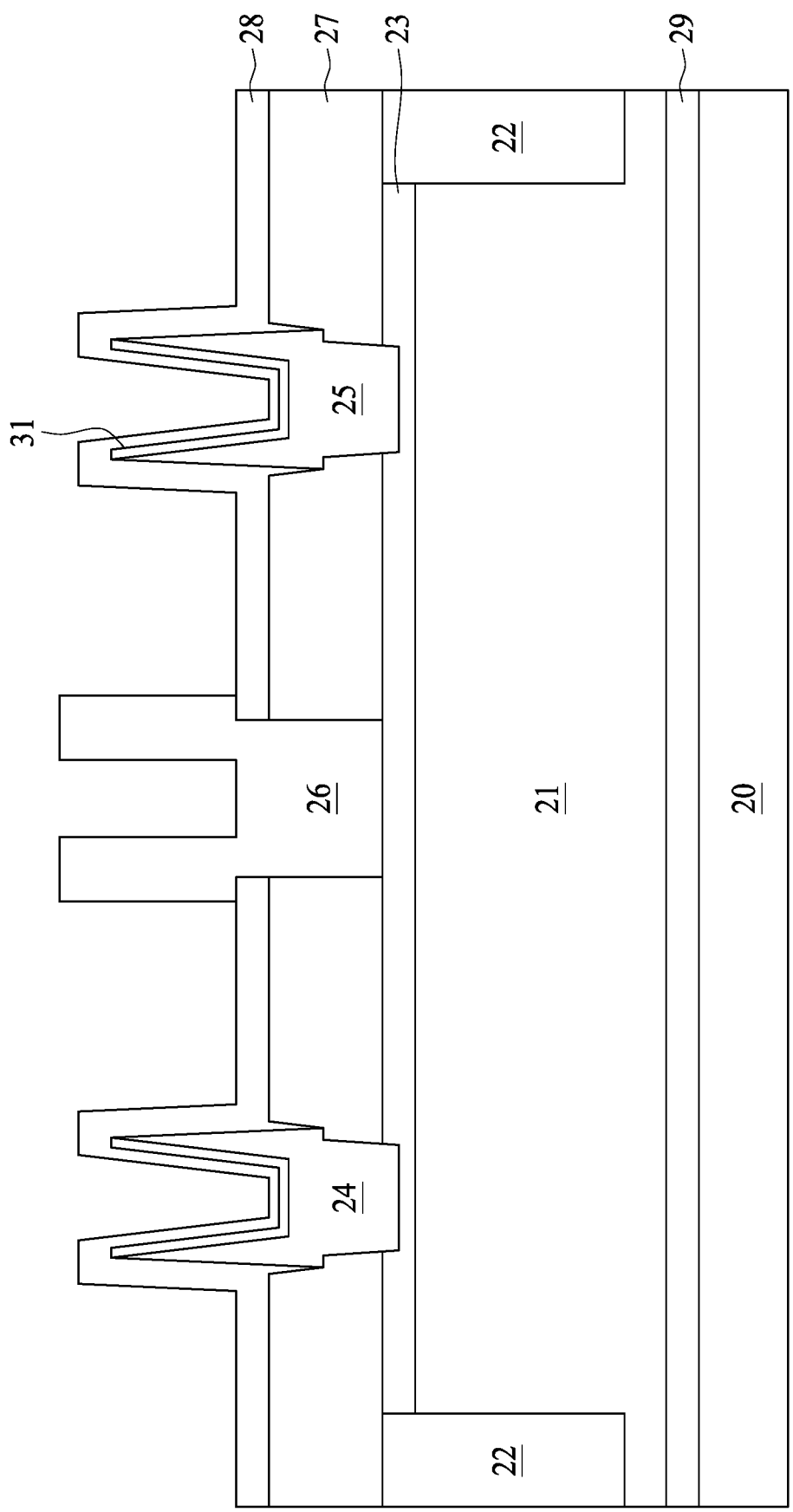

FIG. 3A to FIG. 3F are cross-sectional views of a CMOS-MEMS structure fabricated at various stages, in accordance with some embodiments of the present disclosure. The manufacturing steps shown in FIG. 3A to FIG. 3F are similar to those in FIG. 2C to FIG. 2H except that in FIG. 3A, a hard mask 31 is further deposited on the metal layer 241 by a CVD operation. In some embodiments, the hard mask 31 is lining over the sidewall and heating element bottom of the opening 241o of the metal layer 241. Subsequently, a portion of the hard mask 31 not in the opening 241o is being removed. Referring to FIG. 3D, a portion of the hard mask 31 would be removed and only parts of the source region 24 and the drain region 25 are covered by the hard mask 31. In some embodiments, the hard mask 31 includes nitrides or oxide. In some embodiments, the thickness of the hard mask 31 is in a range from about 50 Å to 500 Å.

In view of the above, the present disclosure provides a semiconductor structure with smaller on resistance by reducing the overlaying width of the source/drain region and the passivation layer. In addition, the present disclosure provides a method for manufacturing the semiconductor structure by using self-aligned operation without using an extra photoresist or hard mask to form the source/drain region.

One embodiment of the present disclosure provides a semiconductor device. The semiconductor device comprises a substrate, a first III-V compound layer over the substrate, a first passivation layer on the first III-V compound layer, a source region and a drain region. The source region penetrates the first passivation layer to electrically contact the first III-V compound layer. The drain region penetrates the first passivation layer to electrically contact the first III-V compound layer. A sidewall of the first passivation layer contacting with the source region comprises a stair shape.

One embodiment of the present disclosure provides a high electron mobility transistor (HEMT). The HEMT comprises a substrate, a first III-V compound layer over the substrate, a first passivation layer on the first III-V compound layer, a source region and a drain region. The source region penetrates the first passivation layer to electrically contact the first III-V compound layer. The drain region penetrates the first passivation layer to electrically contact the first III-V compound layer. An upper portion of the source region overlays the first passivation layer, and a width of the upper portion overlaying the first passivation layer is in a range from approximately 0.03 μm to approximately 0.05 μm.

One embodiment of the present disclosure provides a method of manufacturing a semiconductor device, comprising: providing a substrate, forming a first III-V compound layer over the substrate, forming a first passivation layer over the first III-V compound layer, forming a first opening from a top surface of the first passivation layer to the first III-V compound layer, each opening having a stair-shaped sidewall at the first passivation layer, depositing a metal layer over the first passivation layer and in the first opening, the metal layer having a second opening above the corresponding first opening, and removing a portion of the metal layer to form a source region and a drain region.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A method for manufacturing a semiconductor device, comprising:
   providing a substrate;
   forming a first III-V compound layer over the substrate;
   forming a first passivation layer over the first III-V compound layer;
   forming a plurality of first openings from a top surface of the first passivation layer to the first III-V compound layer, each of the plurality of first openings having an upper portion wider than a lower portion;
   depositing a metal layer over the first passivation layer and in the plurality of first openings, the metal layer having a plurality of second openings above and corresponding to each of the plurality of first openings; and
   removing a portion of the metal layer to form a source electrode and a drain electrode.

2. The method of claim 1, wherein forming the source electrode and the drain electrode further comprises:
   placing a photoresist over the metal layer and in the plurality of second openings;
   removing a portion of the photoresist until the remaining photoresist being in the plurality of second openings; and
   etching a portion of the metal layer not covered by the photoresist to form the source electrode and the drain electrode.

3. The method of claim 1, wherein the metal layer is deposited using sputtering, atomic layer deposition (ALD) or physical vapor deposition (PVD).

4. The method of claim 1, wherein a width difference between the upper portion and the lower portion of each of the plurality of first openings is in a range from approximately 0.03 μm to approximately 0.05 μm.

5. The method of claim 1, before removing a portion of the metal layer, further comprising forming a hard mask lining the plurality of second openings of the metal layer.

6. The method of claim 5, further comprising placing a photoresist over the metal layer and in the plurality of second openings after forming the hard mask.

7. The method of claim 1, wherein removing the portion of the metal layer comprises performing a reactive ion etch operation.

8. The method of claim 1, further comprising:
   forming a second passivation layer over the source electrode and the drain electrode after removing the portion of the metal layer; and
   forming an opening in the second passivation layer and the first passivation layer between the source electrode and the drain electrode.

9. A method for manufacturing a semiconductor device, comprising:
   providing a substrate;
   forming a first III-V compound layer over the substrate;
   forming a plurality of first openings from a top surface of the first III-V compound layer;
   depositing a metal layer in the plurality of first openings, the metal layer having a plurality of second openings above and corresponding to each of the plurality of first openings;
   forming a photoresist in the plurality of second openings;
   removing a portion of the photoresist such that a remaining photoresist is only disposed in the plurality of second openings; and removing a portion of the metal layer to form a source electrode and a drain electrode.

10. The method of claim 9, wherein forming the photoresist in the plurality of second openings comprises:
forming a photoresist layer over the metal layer and filling the plurality of second openings of the metal layer; and
etching back the photoresist to expose a top surface of the metal layer.

11. The method of claim 9, wherein forming the plurality of first openings from the top surface of the first III-V compound layer comprises:
forming a first passivation layer over the first III-V compound layer; and
forming the plurality of first openings in the first passivation layer and the first III-V compound layer.

12. The method of claim 11, wherein the plurality of first openings comprises a lower portion and an upper portion, the lower portion is narrower than the upper portion.

13. The method of claim 12, wherein the lower portion is narrower than the upper portion by approximately 0.06 μm to approximately 0.10 μm.

14. The method of claim 11, wherein depositing the metal layer in the plurality of first openings comprises depositing the metal layer over a top surface and in the plurality of first openings of the first passivation layer.

15. The method of claim 9, wherein depositing the metal layer comprises sputtering, atomic layer deposition (ALD) or physical vapor deposition (PVD).

16. The method of claim 9, wherein removing the portion of the metal layer comprises performing a reactive ion etch operation.

17. A method for manufacturing a semiconductor device, comprising:
providing a substrate;
forming a first III-V compound layer over the substrate;
forming a first opening from a top surface of the first III-V compound layer;
depositing a metal layer in the first opening, the metal layer having a second opening above and corresponding to the first opening; and
removing a portion of the metal layer to form a source electrode, the source electrode comprising:
an upper part having a first width; and
a lower part having a second width, the first width being greater than the second width,
wherein an upper portion of the source electrode further comprises a third width measured from one side to an opposite side of an outer circumference of the upper portion, the third width being smaller than the first width.

18. The method of claim 17, further comprising forming a passivation layer over the upper portion of the source electrode having the third width.

19. The method of claim 18, further comprising forming a second opening in the passivation layer and adjacent to the source electrode.

20. The method of claim 17, further comprising forming a hard mask lining the second opening of the metal layer.

* * * * *